United States Patent [19]

Mori et al.

[11] Patent Number: 5,311,074
[45] Date of Patent: May 10, 1994

[54] SEMICONDUCTOR INTEGRATED CIRCUIT DEVICE WITH CROSSTALK PREVENTION

[75] Inventors: Toshiaki Mori; Takashi Yoshimori, both of Yokohama, Japan

[73] Assignee: Kabushiki Kaisha Toshiba, Kawasaki, Japan

[21] Appl. No.: 829,373

[22] Filed: Feb. 3, 1992

[30] Foreign Application Priority Data

Feb. 4, 1991 [JP] Japan .................................. 3-013514

[51] Int. Cl.$^5$ ............................................. H03K 17/16
[52] U.S. Cl. ..................................... 307/443; 307/475
[58] Field of Search ..................... 307/475, 465.1, 465, 307/443

[56] References Cited

U.S. PATENT DOCUMENTS

| 4,879,480 | 11/1989 | Suzuki et al. | 307/475 |
| 4,931,672 | 6/1990 | Khan | 307/475 |
| 4,973,863 | 11/1990 | Gotta, III et al. | 307/475 |
| 5,023,488 | 6/1991 | Gunning | 307/475 |
| 5,084,637 | 1/1992 | Gregor | 307/475 |
| 5,115,434 | 5/1992 | Aizaki | 307/475 |

Primary Examiner—Edward P. Westin
Assistant Examiner—Andrew Sanders
Attorney, Agent, or Firm—Foley & Lardner

[57] ABSTRACT

A semiconductor integrated circuit device including: a large scale cell array; a through wiring passing through a first region within which the large scale cell array is formed; an input buffer connected to one end of the through wiring at the boundary between the first region and a second region within which the large scale cell array is not formed, the input buffer converting the level of a signal inputted from the second region to a smaller level and transmitting the signal of the smaller level to the first region; and an output buffer circuit connected to the other end of the through wiring at the boundary, the output buffer converting the level of the signal transmitted from the first region to a larger level and transmitting the signal of large level to the second region.

3 Claims, 1 Drawing Sheet

SEMICONDUCTOR INTEGRATED CIRCUIT DEVICE WITH CROSSTALK PREVENTION

BACKGROUND OF THE INVENTION

The present invention relates to semiconductor integrated circuit devices.

Cells in a semiconductor integrated circuit device include general logic cells and large scale cells. General logic cells are disposed in separate regions of a macro cell region and a wiring region. In the macro cell region, logic elements constructed of a plurality of transistors or the like are formed. Large scale cells, typically memory cells, are disposed on the basis of optimized design for the purpose of improving the operation speed, integration, and the like, so that there is no separation between the macro cell region and the wiring region.

FIG. 3 is a schematic diagram briefly showing the structure of a conventional semiconductor integrated circuit device. In this example, a large scale cell array 22 and general logic cell arrays 23a and 23b are disposed as shown, the large scale cell array 22 and the general logic cell arrays 23a and 23b being interconnected by signal lines 31 and 32. The general logic cell arrays 23a and 23b are interconnected by wiring 35. The large scale cell array 22 has macro cells and wirings contributing only to the operation function of the array 22, and there is no through wiring 34 not directly contributing to the operation function.

The reason for this is as follows. The large scale cell array, for example, a memory cell array, includes cells of small size and capacity. The amplitude between logical signal levels "0" and "1" is set small at sense amplifiers, word lines and bit lines in order to realize high speed operation. Therefore, if a through wiring 34 not directly contributing to the operation function of the large scale cell array 22 passes through this array, there is ample possibility of a malfunction caused by crosstalk noises from a large amplitude signals on the through wiring 34. For this reason, the through wiring 34 is disposed so as not to pass through this array 22.

However, since the through wiring 34 is not allowed to pass through the large scale cell array 22, the general logic cell arrays 23a and 23b are required to be interconnected by a wiring 33 which by-passes the large scale cell array 22, hindering high integration. Such poor integration poses a serious problem under the present technical progress of wiring techniques for three-layers or more, and even four-layers.

SUMMARY OF THE INVENTION

It is therefore an object of the present invention to provide a semiconductor integrated circuit device capable of improving device integration.

According to the present invention, there is provided a semiconductor integrated circuit device including: a large scale cell array; a through wiring passing through a first region within which the large scale cell array is formed; an input buffer connected to one end of the through wiring at the boundary between the first region and a second region within which the large scale cell array is not formed, the input buffer converting the level of a signal inputted from the second region to a smaller level and transmitting the signal of the smaller level to the first region; and an output buffer circuit connected to the other end of the through wiring at the boundary, the output buffer converting the level of the signal transmitted from the first region to a larger level and transmitting the signal of the large level to the second region.

A signal transmitted from a through wiring and inputted to the first region of the large scale cell array is converted by the input buffer into a smaller level signal. A signal passing through the first region is converted by the output buffer into a larger level signal. The signal passing through the region of the large scale cell array is small in level. Therefore, it is possible to suppress crosstalk noise generated within the large scale cell array, and pass the through wiring within this array thereby improving device integration.

Preferably, the input buffer converts the level of an input signal smaller by 50% or more. A signal passing within the first region is small in level, preventing generation of noise.

BRIEF DESCRIPTION OF THE DRAWINGS

In the accompanying drawings.

DESCRIPTION OF THE PREFERRED EMBODIMENTS

Figure 1:
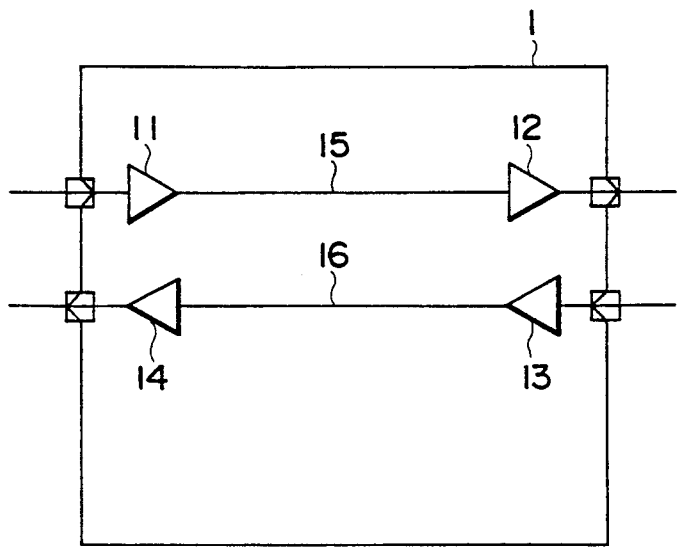
FIG. 1 is a schematic diagram briefly showing the structure of a semiconductor integrated circuit device according to an embodiment of the present invention.

An embodiment of the present invention will be described with reference to the accompanying drawings. FIG. 1 shows the main constitutional elements of a semiconductor integrated circuit device of the embodiment. Through wirings 15 and 16 pass through the region of a large scale cell array 1. An input buffer 11 and output buffers 11 and 12 are provided at opposite ends of the through wiring 15 at the boundary between the region of the large scale cell array 1 and other regions. Similarly, an input buffer 13 and output buffer 14 are provided for the through wiring 16.

Figure 2A:
FIGS. 2A and 2B illustrate a change in amplitude of a signal before and after passing through a through wiring of the semiconductor integrated circuit device.
Figure 2B:
Figure 3:
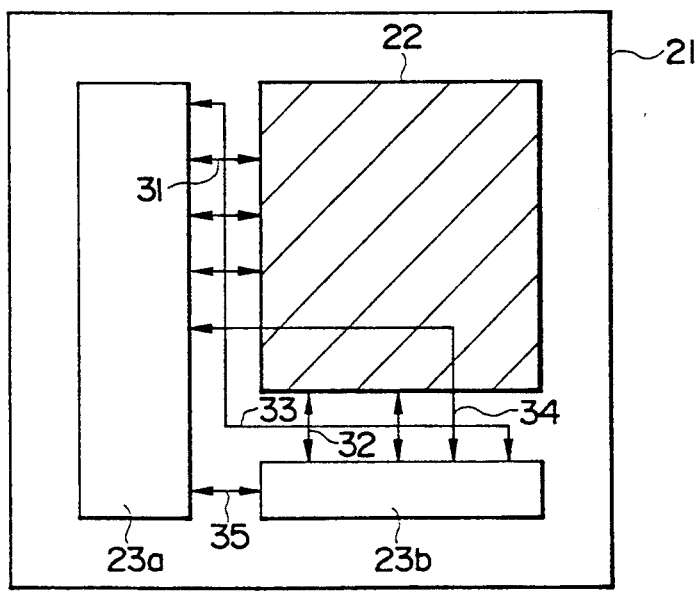
FIG. 3 is a schematic diagram briefly showing a conventional semiconductor integrated circuit device.

The level of a signal transmitted from another region to the region of the large scale cell array 1 is 5 V for example as shown in FIG. 2A. This signal is supplied to the input buffer 11 which level-converts the input signal from 0.8 to 1.0 V for example, as shown in FIG. 2B. The signal outputted from the input buffer 11 transmits over the through wiring 15 on the region of the large scale cell array 1, and inputs to the output buffer 12. The output buffer level-converts the input signal to 5 V as shown in FIG. 2A and outputs it to another region. Similar to the through wiring 15, a signal of 0.8 to 1.0 V level converted by the input buffer 13 is transmitted through the through wiring 15, 16 on the region of the large scale cell array 1, and input to the output buffer 14 which level-converts it to 5 V and outputs it to another region.

In the above manner, a signal transmitted from a general logic cell array having a logical level of 5 V is converted to a lower level for passing through the region of the large scale cell array 1, and thereafter is converted to the original logical level. It is therefore possible to suppress the adverse effects of crosstalk noises from signals on the through wirings 15 and 16, to the large scale cell array 1, preventing malfunction at the large scale cell array 1 including such as small capacity memory cells, sense amplifiers, word lines and bit lines with a small logical level.

According to the present embodiment, it is possible to prevent malfunction of the large scale cell array 1, and dispose the through wirings 15 and 16 within the region of the array 1. Wirings such as those interconnecting other general logic cell arrays can be disposed without by-passing the large scale cell array, thus improving device integration.

The above embodiment has been described by way of example only, and is not intended to limit the scope of the present invention. Other circuits may be used in place of the input and output buffers so long as they can convert the level of a signal. For example, a slue rate buffer (signal rise and fall time control buffer) may be used.

What is claimed is:

1. A semiconductor integrated circuit device, comprising:
   a large scale cell array;
   a wiring which is formed in a first region within which the large scale cell array is formed, in which the wiring transfers a first signal which has a level needed for an operation of the large scale cell array and is used in the large scale cell array;
   a through wiring which passes through the first region, in which the through wiring transmits a second signal which is smaller in level than the first signal;
   an input buffer circuit which is connected to one end of the through wiring at a boundary between the first region and a second region within which the large scale cell array is not formed, the first signal transmitted from the second region being inputted into the input buffer, wherein said input buffer converts the level of the first signal to a smaller level, and outputs and transmits the second signal to the first region; and
   an output buffer circuit which is connected to the other end of the through wiring at the boundary, in which the second signal is directly input to said output buffer circuit without being used in the large scale cell array, wherein said output buffer circuit converts a level of the second signal to a large level, and outputs an transmits a third signal to the second region.

2. The semiconductor integrated circuit device according to claim 1 wherein the input buffer circuit converts the level of the first signal inputted thereto to a level smaller by 50% or more, and
   the output buffer circuit converts the level of the second signal inputted thereto to a larger level so as to have substantially the same level as the first signal.

3. The semiconductor integrated circuit device according to claim 1, wherein the input buffer circuit converts the first signal inputted thereto having a level of about 5 V to the second signal having a level of 0.8 to 1.0 V, and
   the output buffer circuit converts the second signal inputted thereto having a level of 0.8 to 1.0 V to the third signal having the level of about 5 V.

* * * * *